(12) United States Patent
Grundbacher et al.

(10) Patent No.: US 6,396,679 B1
(45) Date of Patent: May 28, 2002

(54) SINGLE-LAYER DIELECTRIC STRUCTURE WITH ROUNDED CORNERS, AND CIRCUITS INCLUDING SUCH STRUCTURES

(75) Inventors: Ronald W. Grundbacher, Hermosa Beach; Richard Lai, Redondo Beach; Roger S. Tsai, Torrance; Michael E. Barsky, Sherman Oaks, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/691,459

(22) Filed: Oct. 18, 2000

(51) Int. Cl.$^7$ ............................................. H01G 4/228
(52) U.S. Cl. .................... 361/306.3; 361/311; 361/313; 361/309; 361/321.5; 438/398
(58) Field of Search .............................. 361/306.3, 313, 361/311, 321.1, 328, 309, 644, 301, 320, 321.5, 308.3; 438/398

(56) References Cited

U.S. PATENT DOCUMENTS

| | | | |
|---|---|---|---|
| 4,410,622 A | * | 10/1983 | Dalal et al. ................. 430/312 |
| 5,313,360 A | * | 5/1994 | Stockman ................... 361/328 |
| 5,461,202 A | * | 10/1995 | Sera et al. .................. 174/254 |
| 5,849,624 A | | 12/1998 | Fazan et al. |
| 5,926,359 A | * | 7/1999 | Greco et al. ................ 361/311 |
| 5,985,732 A | | 11/1999 | Fazan et al. |
| 6,034,864 A | | 3/2000 | Naito et al. |
| 6,038,134 A | | 3/2000 | Belter |
| 6,049,101 A | | 4/2000 | Graettinger et al. |
| 6,263,142 B1 | * | 7/2001 | Mardirossian et al. ...... 385/135 |

* cited by examiner

Primary Examiner—Dean A. Reichard
Assistant Examiner—Nguyen T Ha
(74) Attorney, Agent, or Firm—Antonelli, Terry, Stout & Kraus, LLP

(57) ABSTRACT

A single-layer, metal-insulator-metal capacitor, a monolithic microwave integrated circuit including such capacitors, and a process of fabricating such capacitors. The capacitor has a single layer of insulating material between two metallic layers. At least one of the metallic layers has rounded corners, reducing the electric field at the corners, and so lessening the likelihood of breakdown. In one preferred embodiment, each metal layer has rounded corners. The capacitors can be fabricated by an optical lithographic process.

12 Claims, 10 Drawing Sheets

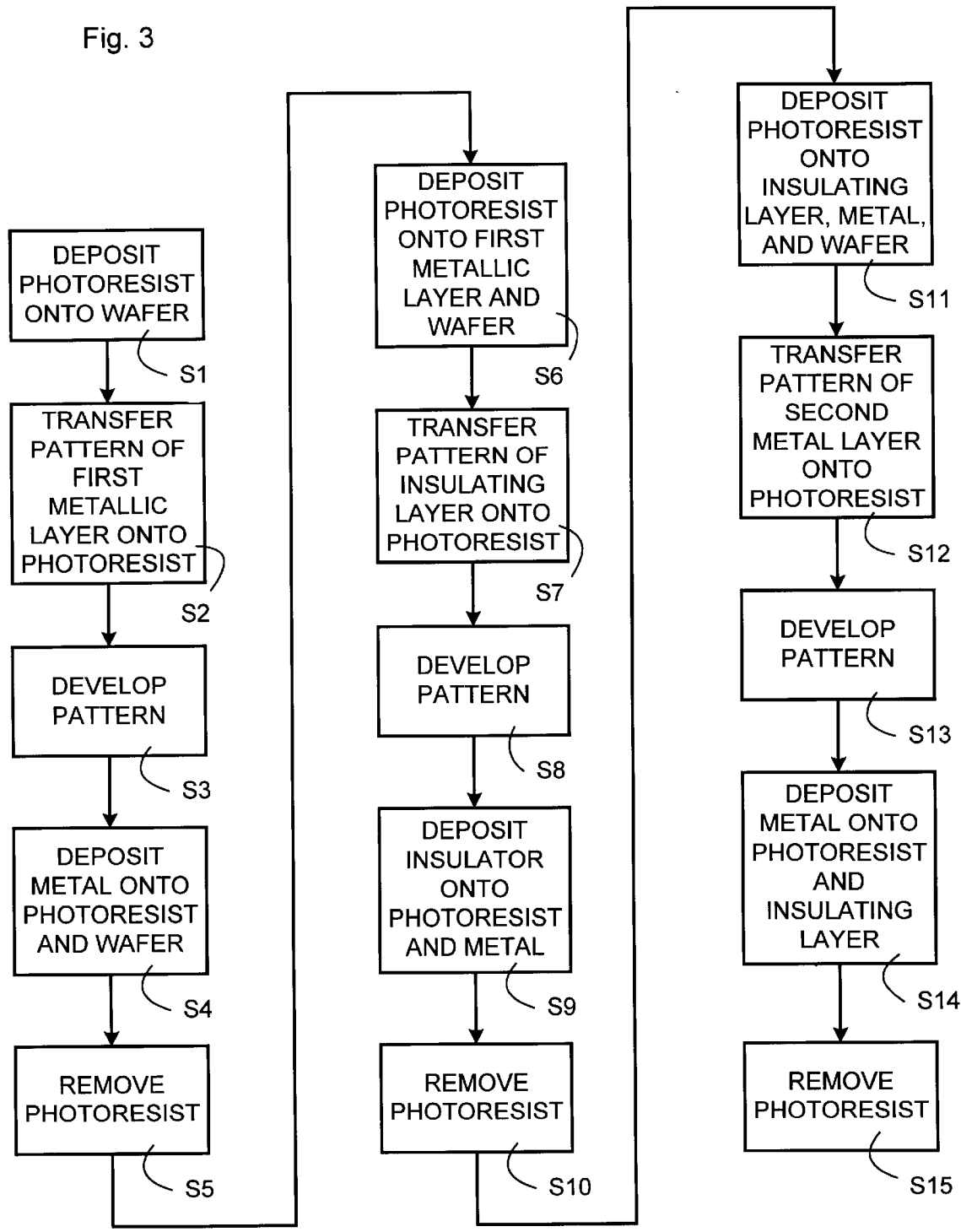

SINGLE-LAYER DIELECTRIC STRUCTURE WITH ROUNDED CORNERS, AND CIRCUITS INCLUDING SUCH STRUCTURES

FIELD OF THE INVENTION

The present invention pertains to capacitors having rounded corners. More particularly, the present invention pertains to single-layer, metal-insulator-metal capacitors in which at least one of the metallic layers have rounded corners to reduce the electric fields at the corners, and therefore to reduce the likelihood of breakdown. The present invention further pertains to monolithic microwave integrated circuits (MMICs) including such capacitors.

BACKGROUND OF THE INVENTION

Capacitors of a metal-insulator-metal structure conventionally have right angle corners. These sharp corners have high electric fields, with the result that breakdown often occurs at the corners. As a consequence, the capacitors must be replaced. This can be a significant problem, particularly in applications such as MMICs which must be reworked or scrapped when a capacitor breaks down. U.S. Pat. Nos. 5,849,624 and 6,049,101 disclose stacked capacitors having rounded upper edges. While such stacked capacitors are useful in many applications, other applications require the use of planar capacitors. U.S. Pat. No. 6,034,864 discloses a multilayer capacitor in which various of the layers have rounded corners. Again, such multilayer capacitors are useful in certain applications, but they are large and bulky, and so are not usable in applications calling for a single layer planar capacitor. Additionally, such multi-layer capacitors are complex to manufacture.

SUMMARY OF THE INVENTION

The present invention is a single layer, metal-insulator-metal capacitor having rounded corners on at least one of the metal layers so as to reduce the electric fields and thereby lessen the likelihood of breakdown. By "single-layer, metal-insulator-metal capacitor" is meant a capacitor having a single insulating layer between two metallic layers. Such a capacitor thus includes a first metallic layer with a substantially planar first surface, a substantially planar second surface extending substantially parallel with and substantially coextensive with the first metallic layer first surface, and planar side surfaces joining the first metallic layer first and second surfaces. The capacitor further includes an insulating layer with a substantially planar first surface, a substantially planar second surface extending substantially parallel with and substantially coextensive with the insulating layer first surface and contacting at least a substantial portion of the first metallic layer first surface, and planar side surfaces joining the insulating layer first and second surfaces. Further, the capacitor includes a second metallic layer with a substantially planar first surface, a substantially planar second surface extending substantially parallel with and substantially coextensive with the second metallic layer first surface and contacting at least a substantial portion of the insulating layer first surface, and planar side surfaces joining the second metallic layer first and second surfaces. In accordance with the present invention the second metallic layer first and second surfaces having rounded corners provided by the second metallic layer side surfaces. In one preferred embodiment, the first metallic layer first and second surfaces also have rounded corners provided by the first metallic layer side surfaces.

In a preferred embodiment, the length and width of the insulating layer are less than the length and width, respectively, of the first metallic layer, and the length and width of the second metallic layer are less than the length and width, respectively, of the insulating layer.

Alternatively, the length of the insulating layer can be greater than the length of the first metallic layer, and the width of the insulating layer can be greater than the width of the first metallic layer. In such case, the length of the second metallic layer can be substantially the same as the length of the first metallic layer and the width of the second metallic layer can be substantially the same as the width of the first metallic layer. Alternatively, the length of the second metallic layer can be less than the length of the first metallic layer, and the width of the second metallic layer can be less than the width of the first metallic layer.

In another embodiment, the length and width of the insulating layer can be substantially the same as the length and width, respectively, of the first metallic layer. In a further embodiment, the lengths of the all of the layers can be substantially the same, and the widths of all of the layers can be substantially the same.

The present invention further is a MMIC (Monolithic Microwave Integrated Circuit) including such capacitors.

The present invention additionally is a process of fabricating capacitors of the above type. In one preferred embodiment, the process includes depositing a first photoresist layer onto a wafer, transferring onto the first photoresist layer a pattern of the first metallic layer, developing the pattern of the first metallic layer, depositing metal onto the developed pattern and any remaining photoresist, removing the remaining photoresist and the metal deposited thereon to leave the first metallic layer on the wafer, depositing a second photoresist layer onto the first metallic layer and the wafer, transferring onto the second photoresist layer a pattern of the insulating layer, developing the pattern of the insulating layer, depositing insulating material onto the developed pattern and any remaining photoresist, removing the remaining photoresist and the insulating material deposited thereon to leave the insulating layer on the first metallic layer, depositing a third photoresist layer onto the insulating layer and exposed portions of the first metallic layer and the wafer, transferring onto the third photoresist a pattern having a rounded corners, the pattern being the pattern of the second metallic layer, developing the pattern of the second metallic layer, depositing metal onto the developed pattern of the second metallic layer and any remaining photoresist, and removing the remaining photoresist and metal deposited thereon to leave the second metallic layer with rounded corners on the insulating layer. If desired, the pattern of the first metallic layer can also have rounded corners. In one preferred embodiment, the length and width of the pattern of the insulating layer are less than the length and width, respectively, of the pattern of the first metallic layer, and the length and width of the pattern of the second metallic layer are less than the length and width, respectively, of the pattern of the insulating layer.

In another preferred embodiment, the process of the present invention includes depositing a first photoresist layer onto a wafer, transferring onto the first photoresist layer the pattern of the first metallic layer, developing the pattern of the first metallic layer, depositing metal onto the developed pattern and any remaining photoresist, and removing the remaining photoresist and the metal deposited thereon to leave the first metallic layer on the wafer, depositing an insulating layer onto the first metallic layer and exposed portions of the wafer, depositing a second photoresist layer onto the insulating layer, transferring onto the second photoresist layer a pattern having rounded corners, the pattern being the pattern of the second metallic layer, developing the pattern of the second metallic layer, depositing metal onto the developed pattern of the second metallic layer and any remaining photoresist, and removing the remaining photoresist and the metal deposited thereon to leave the second metallic layer with rounded corners on the insulating layer. Again, if desired, the pattern of the first metallic layer can have rounded corners. Further, the length of the pattern of the second metallic layer can be substantially the same as the length of the first metallic layer, and the width of the second metallic layer can be substantially the same as the width of the first metallic layer.

In another preferred embodiment, the process of the present invention includes depositing a first layer of metal onto a wafer, depositing onto the first layer of metal the pattern of the first metallic layer, etching the first layer of metal to conform with the pattern so as to provide the first metallic layer, depositing an insulating layer onto the first metallic layer and exposed portions of the wafer, depositing a second layer of metal onto the insulating layer, depositing onto the second layer of metal a pattern having rounded corners, the pattern being the pattern of the second metallic layer, and etching the second layer of metal to conform with the pattern so as to provide the second metallic layer. Again, the pattern of the first metallic layer can have rounded corners. Further, the pattern of the first metallic layer can be transferred onto the first layer of metal by depositing a layer of photoresist onto the first layer of metal, transferring the pattern of the first metallic layer onto the photoresist, and developing the pattern. Likewise, the pattern of the second metallic layer can be transferred onto the second layer of metal by depositing a layer of photoresist onto the second layer of metal, transferring the pattern of the second metallic layer onto the photoresist, and developing the pattern.

BRIEF DESCRIPTION OF THE DRAWINGS

These and other aspects and advantages of the present invention are more apparent from the following detailed description and claims, particularly when considered in conjunction with the accompanying drawings, in which like parts bear like reference numerals. In the drawings:

FIG. 3 is a flowchart of a process of forming a single-layer, metal-insulator-metal capacitor in accordance with a preferred embodiment of the present invention;

DETAILED DESCRIPTION OF PREFERRED EMBODIMENT

Figure 1:
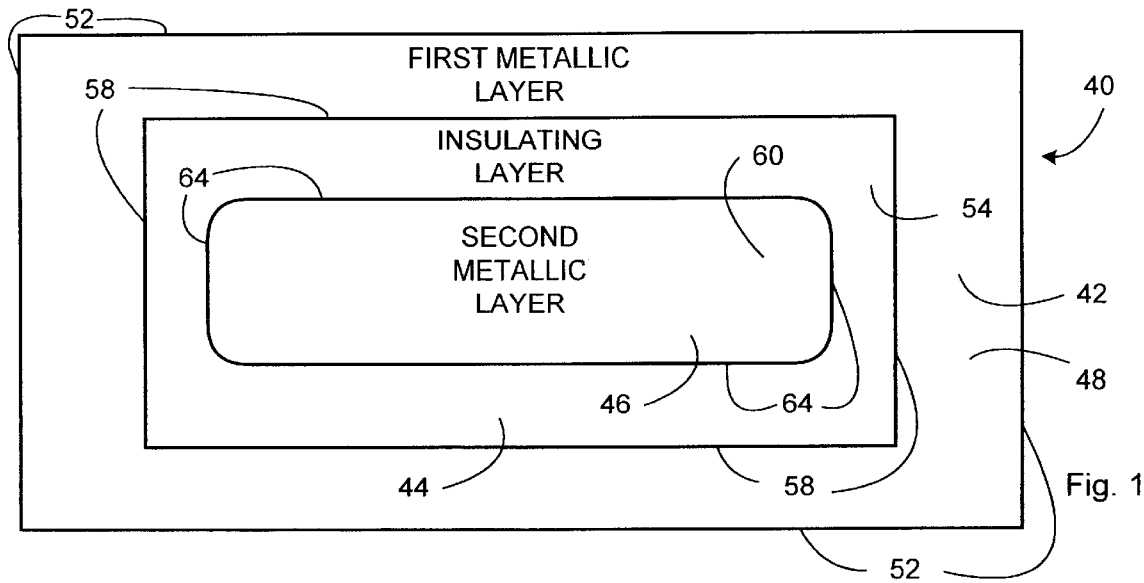
FIG. 1 is a top plan view of a single-layer, metal-insulator-metal capacitor in accordance with a first embodiment of the present invention.
Figure 2:
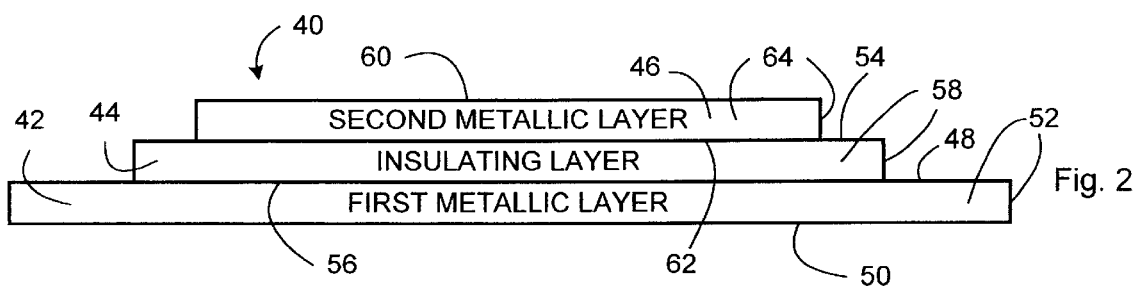
FIG. 2 is a side elevation view of the capacitor of FIG. 1.

FIGS. 1 and 2 depict a single-layer, metal-insulator-metal capacitor 40 in accordance with a first embodiment of the present invention. Capacitor 40 includes a first metallic layer 42, an insulating layer 44, and a second metallic layer 46. First metallic layer 42 has a substantially planar first surface 48, a substantially planar second surface 50 which extends substantially parallel with and substantially coextensive with first surface 48, and planar side surfaces 52 which join the first surface 48 and the second surface 50. Similarly, insulating layer 44 has a substantially planar first surface 54, a substantially planar second surface 56 which extends substantially parallel with and substantially coextensive with the insulating layer first surface 54 and which overlies and contacts at least a substantial portion of first surface 48 of first metallic layer 42, and planar side surfaces 58 which join first surface 54 and second surface 56 of insulating layer 44.

Second metallic layer 46 likewise includes a substantially planar first surface 60, a substantially planar second surface 62 which extends substantially parallel with and substantially coextensive with first surface 60 of second metallic layer 46 and which overlies and contacts at least a substantial portion of first surface 54 of insulating layer 44, and planar side surfaces 64 which join first surface 60 and second surface 62 of second metallic layer 46.

Figure 4:
FIGS. 4–16 are side elevation views illustrating a capacitor being formed in accordance with the flowchart of FIG. 3.
Figure 5:
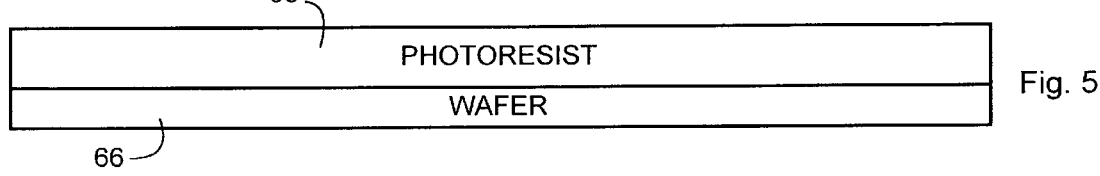
Figure 6:
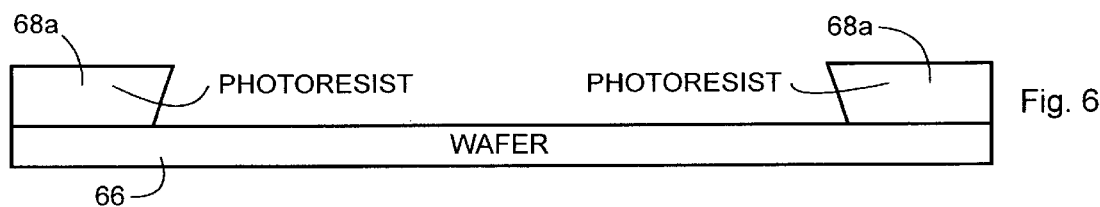
Figure 7:
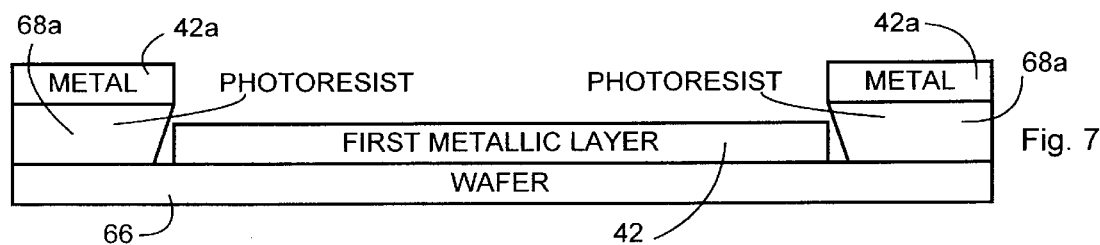
Figure 8:
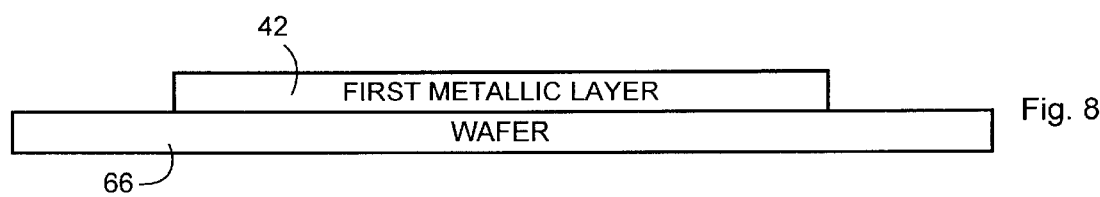
Figure 9:
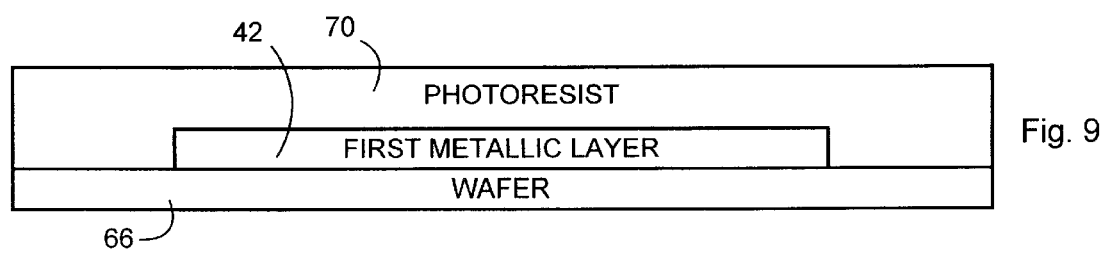
Figure 10:
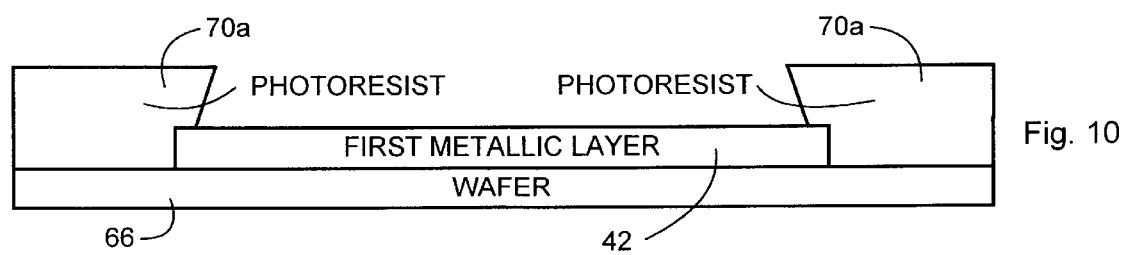
Figure 11:
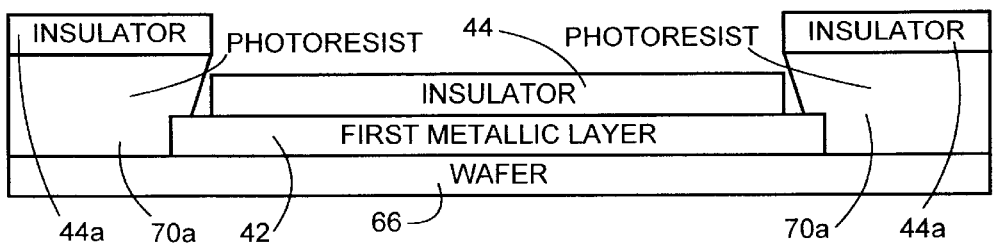
Figure 12:
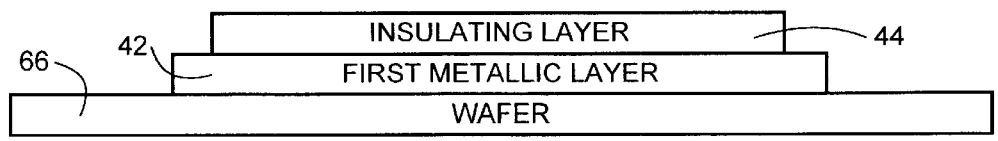

FIGS. 3–16 illustrate the process of forming a single-layer metal-insulator-metal capacitor in accordance with one preferred embodiment of the present invention. In a first step S1, photoresist is deposited onto a wafer, such as a semiconductor wafer, of, for example, gallium arsenide, indium phosphide, or silicon. FIG. 4 depicts a typical such wafer 66, while FIG. 5 depicts the photoresist layer 68 on wafer 66. While the drawings depict wafer 66 as being coextensive with photoresist 68, in practice wafer 66 may be considerably larger than the resulting capacitor so as to accommodate additional circuit components. In a step S2, the pattern of the first metallic layer is transferred onto the photoresist layer 68, for example by an optical lithographic technique using a mask, and in step S3 that pattern is developed, exposing the portions of wafer 66 on which the first metallic layer is to be formed. FIG. 6 depicts the resulting wafer 66 with the remaining portions of the photoresist 68a after the pattern has been developed. Then in a step S4, metal is deposited onto the exposed portion of wafer 66 and onto photoresist 68a, forming the first metallic metal layer 42 on wafer 66 and leaving metal 42a on photoresist 68a, as depicted in FIG. 7. This can be done by an evaporation technique or by plating, for example. In step S5, the photoresist 68a is removed, also removing the metal 42a that is on that photoresist, leaving the first metallic layers 42 on wafer 66, as depicted in FIG. 8. In step S6, another layer of photoresist 70 is deposited onto first metallic layer 42 and the exposed portions of wafer 66, as depicted in FIG. 9. In step S7, the pattern of the insulating layer 44 is deposited onto the photoresist layer 70, again for example by an optical lithographic method, and in step S8 that pattern is developed, exposing the portions of first metallic layer 42 on which the insulating layer is to be formed. FIG. 10 depicts wafer 66 with the remaining photoresist 70a and exposed portions of the first metallic layer 42. In step S9, insulating material is deposited onto the exposed portions of the first metallic layer 42 and onto photoresist 70a, forming insulating layer 44 on first metallic layer 42 and leaving insulator 44a on photoresist 70a. In step S10, the remaining photoresist 70a is removed, removing the insulator 44a that is on that photoresist. This leaves the insulating layer 44 on top of the first metallic layer 42 which, in turn, is on wafer 66, as depicted in FIG. 12.

Figure 13:
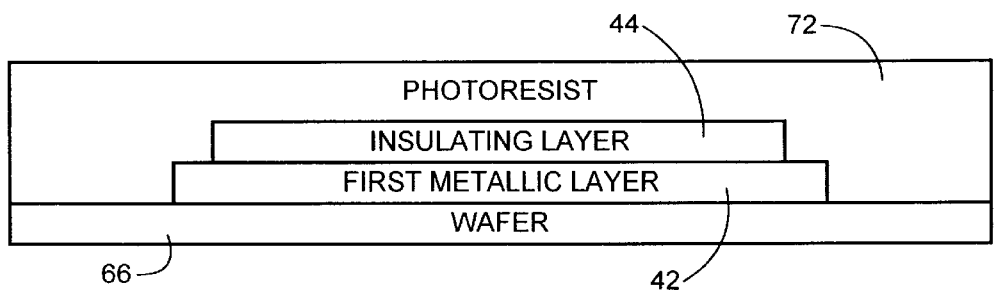
Figure 14:
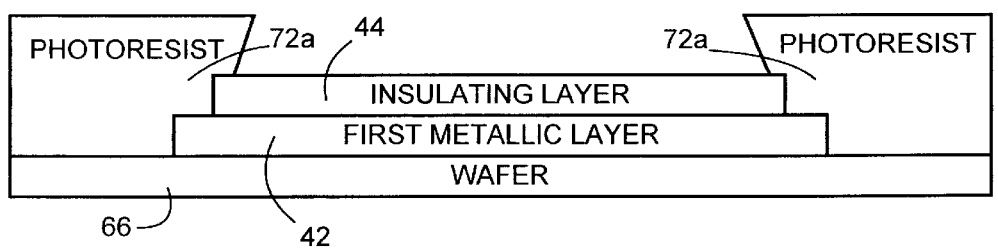
Figure 15:
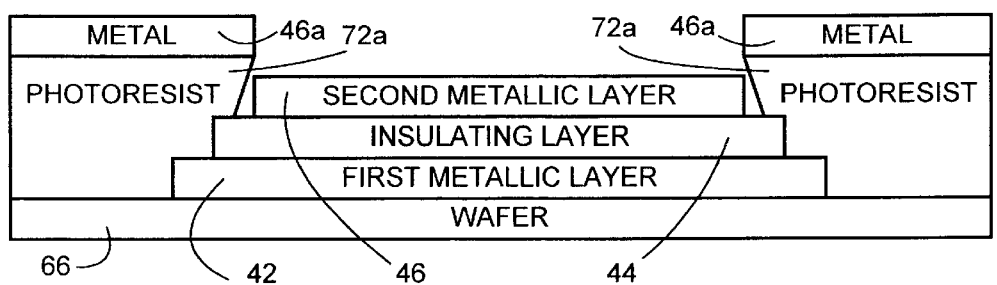
Figure 16:
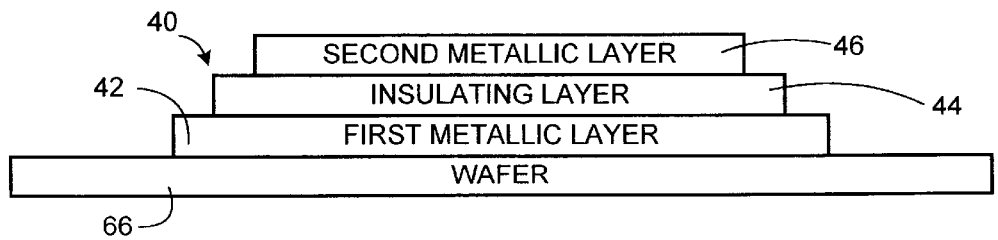

In step S11, another layer of photoresist 72 is deposited onto the insulating layer 44, any exposed portions of the first metallic layer 42, and exposed portions of wafer 66, as depicted in FIG. 13. In step S12, the pattern of the second metallic layer is transferred onto photoresist layer 72, for example by an optical lithographic method, and in step S13 that pattern is developed, exposing the portions of insulating layer 44 on which the second metallic layer is to be formed. This leaves photoresist 72a covering those portions of the insulating layer 44 which are not to be covered by the second metallic layer, as well as covering portions of the first metallic layer 42 and the wafer 66, as depicted in FIG. 14. In step S14 metal is deposited onto the exposed portions of the insulating layer 44 and onto photoresist 72a, for example by an evaporation technique or by plating, forming second metallic layer 46 on insulating layer 44 and leaving metal 46a on photoresist 72a, as depicted in FIG. 15. In step S15, the photoresist 72a is removed, removing the metal 46a that is on it, and leaving the second metallic layer 46 on the insulating layer 44 which is on the first metallic layer 42 which, in turn, is on wafer 66. FIG. 16, thus, depicts the capacitor 40 of FIG. 2 positioned on the wafer 66.

Figure 17:
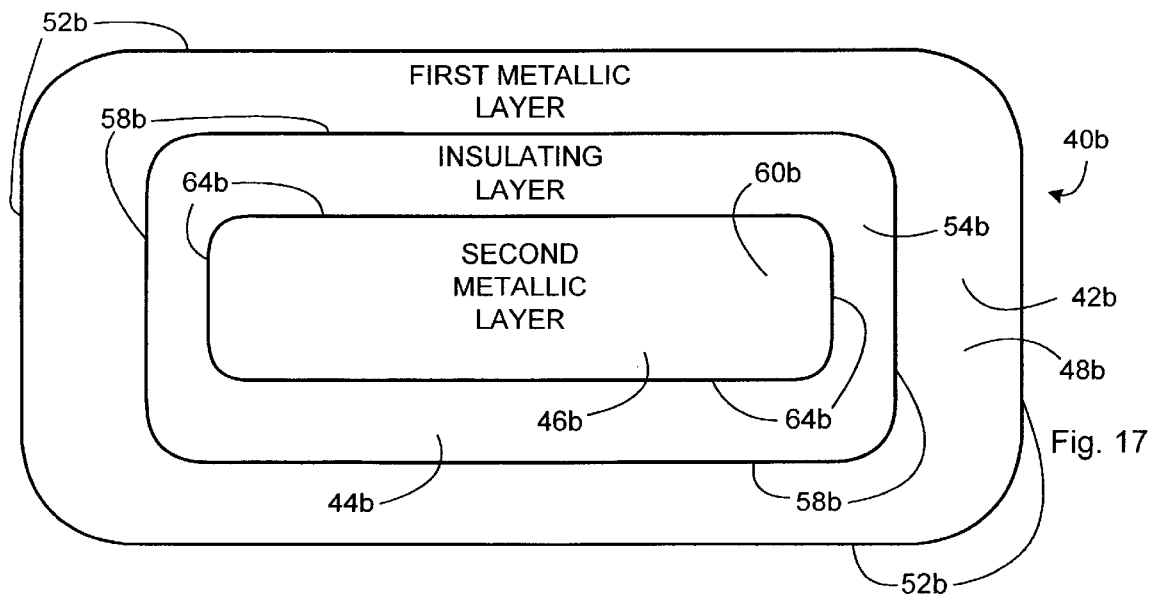
FIG. 17 is a top plan view of a single-layer, metal-insulator-metal capacitor in accordance with a preferred embodiment of the present invention.

Capacitor 40 of FIG. 1 has square corners on first metallic layer 42 and insulating layer 44, and rounded corners on second metallic layer 46. The rounded corners on second metallic layer 46 improve the capacitor performance by reducing the electric field, and thus reducing the likelihood of breakdown. FIG. 17 depicts a second embodiment of a capacitor 40b in which the first metallic layer 42b, the insulating layer 44b, and the second metallic layer 46b all have rounded corners. Alternatively, the insulating layer can have square corners, while both metallic layers and have rounded corners. Rounded corners on both the first metallic layer and the second metallic layer further reduce the likelihood of breakdown. The shape of the pattern of each layer determines whether that layer has rounded corners or square corners.

Figure 18:
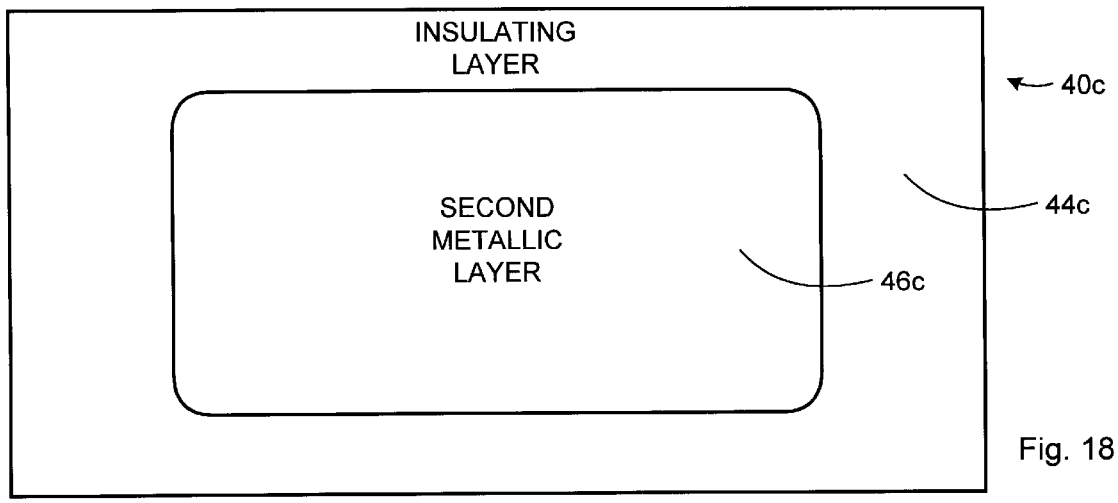
FIG. 18 is a top plan view of a single-layer, metal-insulator-metal capacitor in accordance with another embodiment of the present invention.
Figure 19:
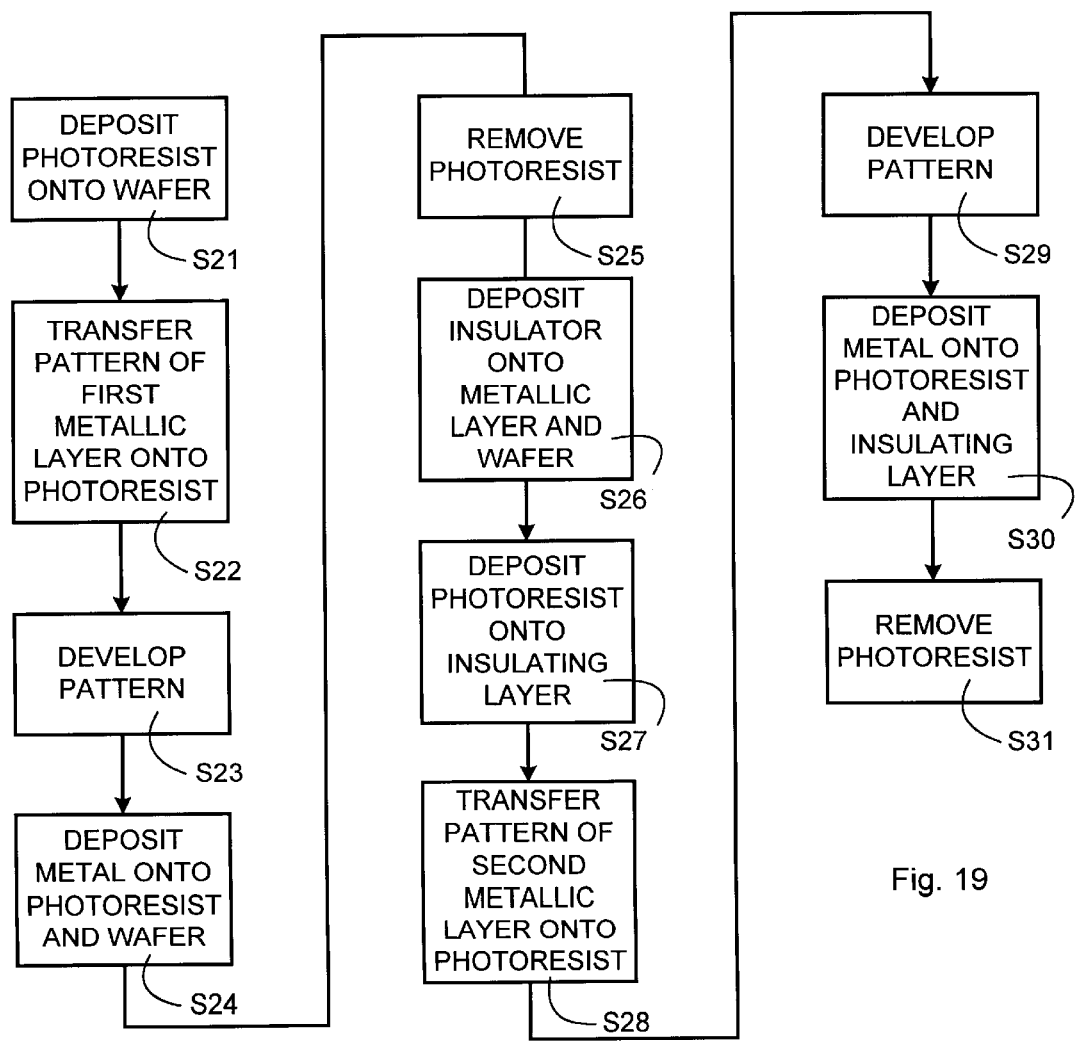
FIG. 19 is a flowchart of a process of fabricating a single-layer, metal-insulator-metal capacitor in accordance with a further preferred embodiment of the present invention.
Figure 20:
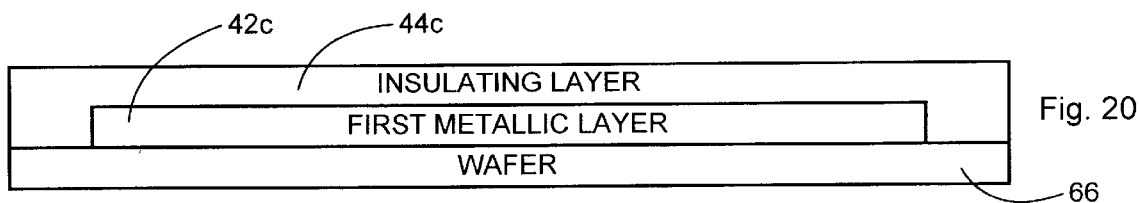
FIGS. 20–24 are side elevational views illustrating a capacitor being formed in accordance with the process of FIG. 19.
Figure 21:
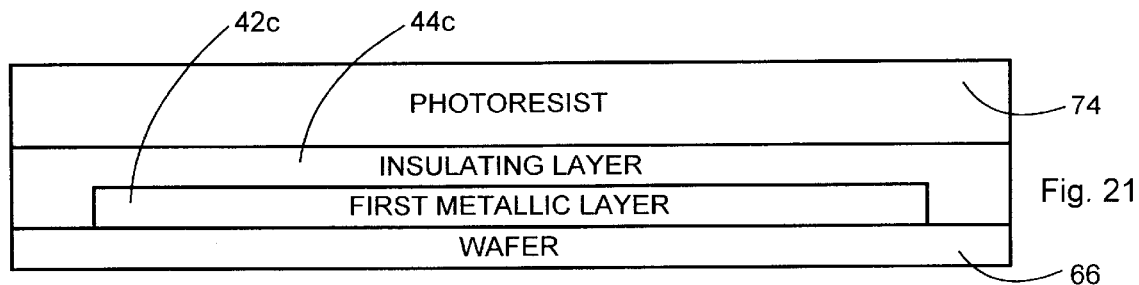
Figure 22:
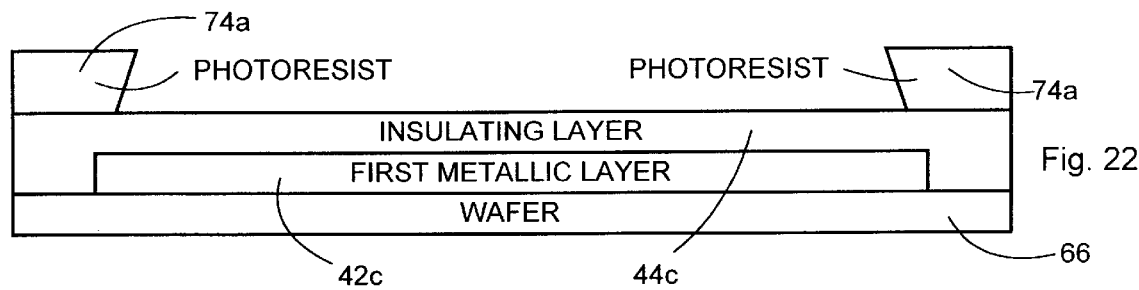
Figure 23:
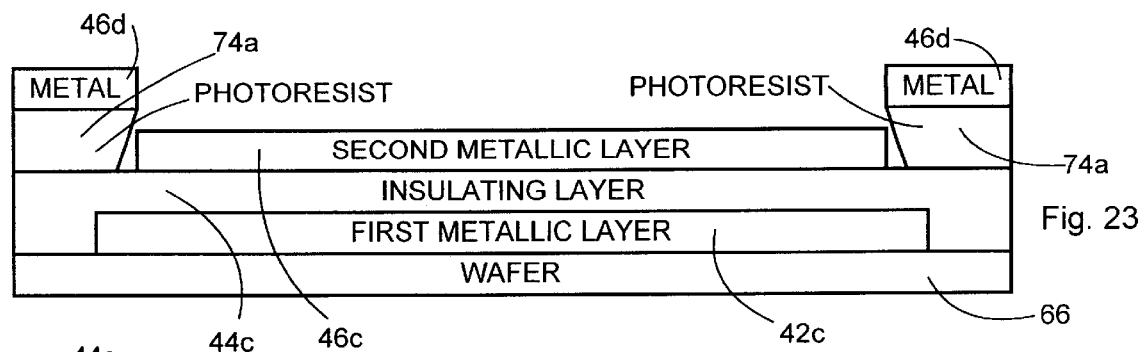
Figure 24:
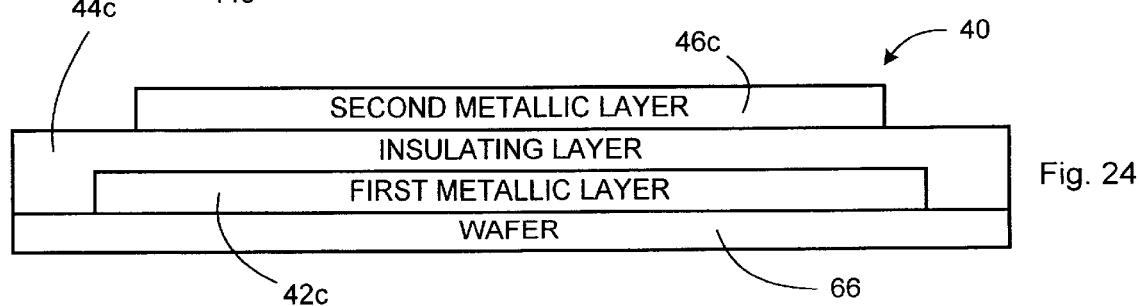

FIGS. 18–24 depict a further embodiment of a single-layer metal-insulator-metal capacitor in accordance with the present invention. FIG. 18 is a top plan view of a capacitor in accordance with this embodiment, and FIG. 19 is a flowchart of the process of this embodiment. Steps S21–S25 are the same as steps S1–S5 of the process depicted in FIG. 3. At that point, the wafer 66 has a first metallic layer 42c formed on it, of the general configuration depicted in FIG. 8. In step S26, a layer of insulating material 44c is deposited on the first metallic layer 42c and the exposed portions of wafer 66, as depicted in FIG. 20. In step S27, a layer of photoresist 74 is deposited onto insulating layer 44c, as depicted in FIG. 21. In step S28, the pattern of the second metallic layer is transferred onto the photoresist layer 74, and in step S29 that pattern is developed, exposing the portions of insulating layer 44c on which the second metallic layer is to be formed, and leaving photoresist 74a covering the remainder of insulating layer 44c, as depicted in FIG. 22. In step S30, metal is deposited onto the exposed portions of insulating layer 44c and onto photoresist 74a, forming second metallic layer 46c on insulating layer 44c and leaving metal 46d on photoresist 74a, as depicted in FIG. 23. In step S31, the photoresist 74a is removed, removing the metal 46d that is on it, forming capacitor 40c with second metallic layer 46c on insulating layer 44c which is on first metallic layer 42c which, in turn, is on wafer 66, as depicted in FIG. 24.

The length of second metallic layer 46, 46b, or 46c can be less than the length of first metallic layer 42, 42b, or 42c, and the width of second metallic layer 46, 46b, or 46c can be less than the width of first metallic layer 42, 42b, or 42c, as depicted in FIGS. 16 and 24. Alternatively, the length of second metallic layer 46, 46b, or 46c can be identical with the length of first metallic layer 42, 42b, or 42c, and the width of second metallic layer 46, 46b, or 46c can be identical with the width of first metallic layer 42, 42b, or 42c. Further, the length and width of insulating layer 44, 44b, or 44c can be the same as or greater than the length and width, respectively of either of the metallic layers. First metallic layer 42c can have rounded corners, just as does second metallic layer 46c, or first metallic layer 42c can have square corners.

Figure 25:
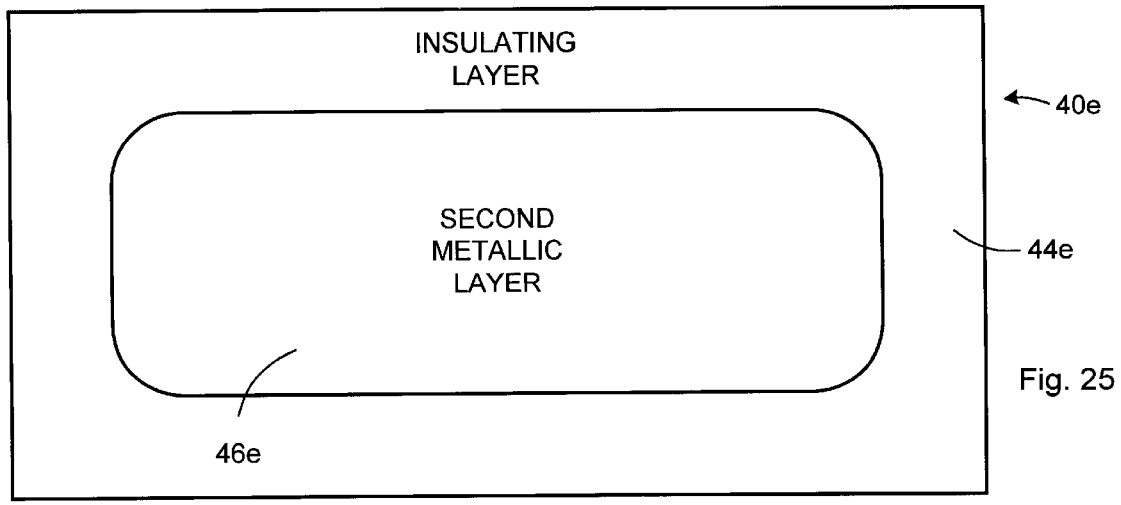
FIG. 25 is a top plan view of a single-layer, metal-insulator-metal capacitor in accordance with yet another embodiment of the present invention.
Figure 26:
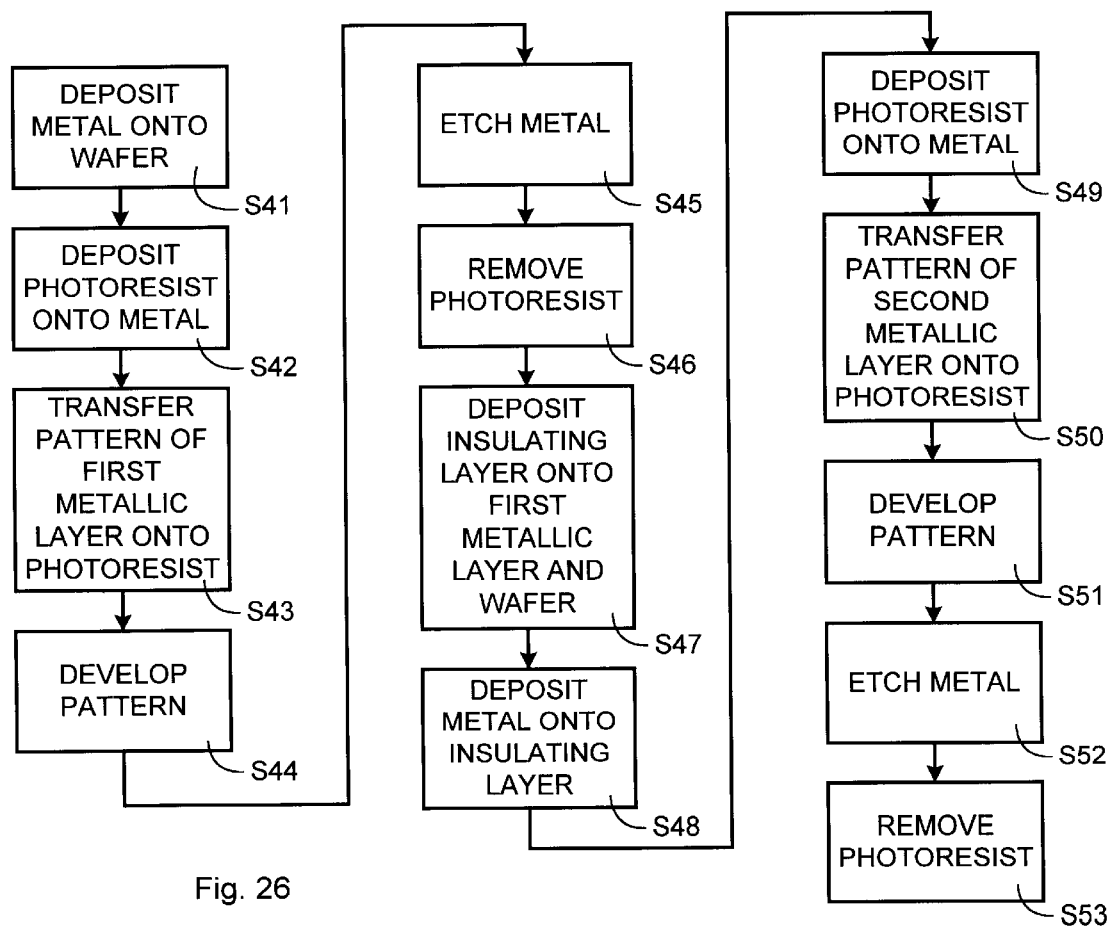
FIG. 26 is a flowchart of a process of forming a single-layer, metal-insulator-metal capacitor in accordance with another preferred embodiment of the present invention.
Figure 27:
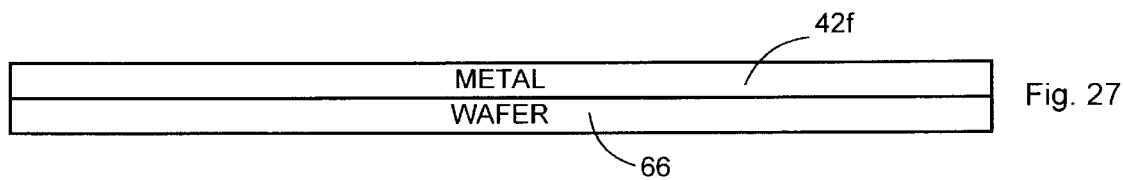
FIGS. 27–35 are side elevational views illustrating a capacitor being formed in accordance with the process of FIG. 26.
Figure 28:
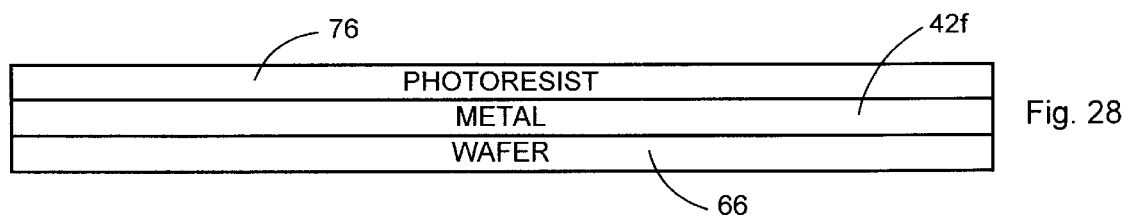
Figure 29:
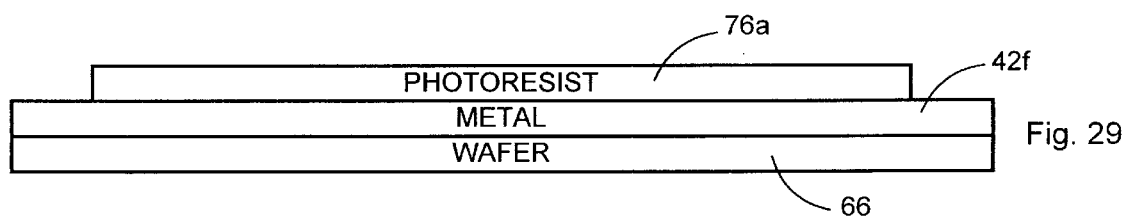
Figure 30:
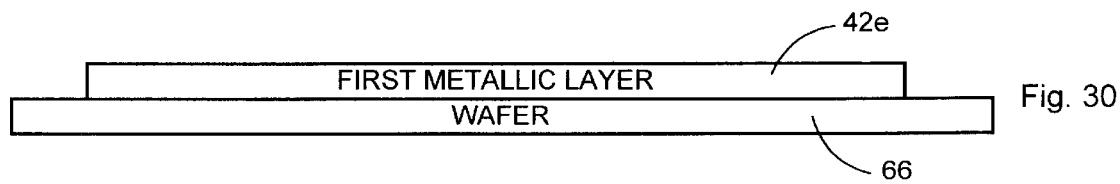

FIGS. 25–35 illustrate further embodiments of the present invention. FIG. 25 depicts a single-layer, metal-insulator-metal capacitor 40e, and FIG. 26 is a flowchart of a preferred process of forming such a capacitor. In a step S41, a first layer of metal 42f is deposited onto wafer 66, as depicted in FIG. 27. In step S42, a layer of photoresist 76 is deposited onto the first layer of metal 42f, as depicted in FIG. 28. The pattern of the first metallic layer is transferred onto photoresist layer 76 in step S43, and in step S44 that pattern is developed, leaving photoresist 76a on those portions of first layer of metal 42f which are to form the first metallic layer of the capacitor, while exposing the remainder of the metal, as depicted in FIG. 29. In step S45, the exposed metal, not covered by photoresist 76a, is etched away, and in step S46 the photoresist 76a is removed, leaving the first metallic layer 42e on wafer 66, as depicted in FIG. 30.

Figure 31:
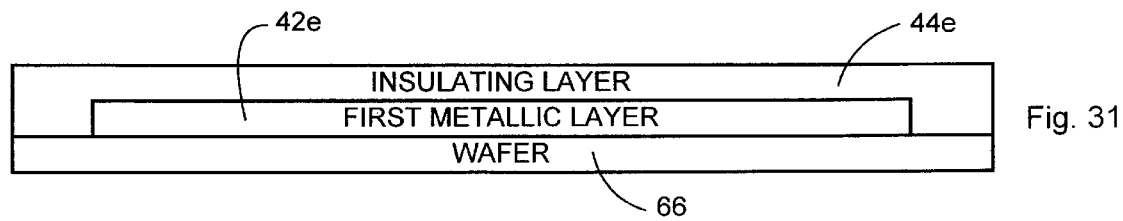
Figure 32:
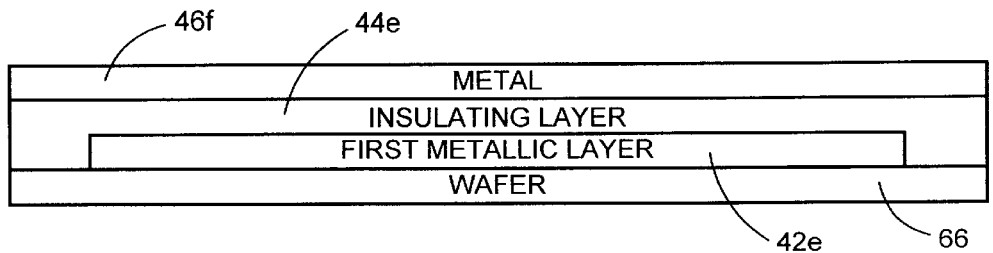
Figure 33:
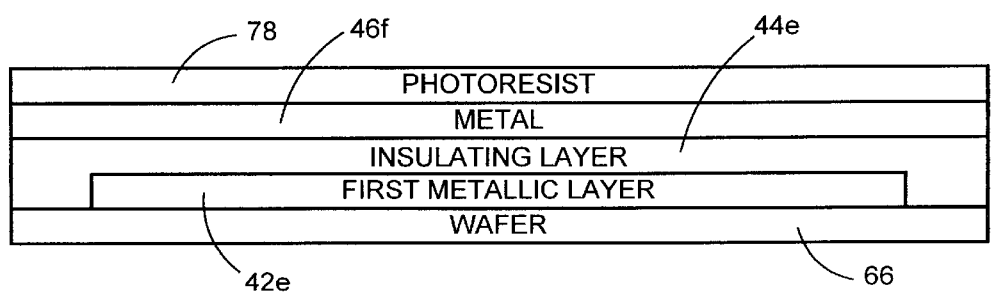
Figure 34:
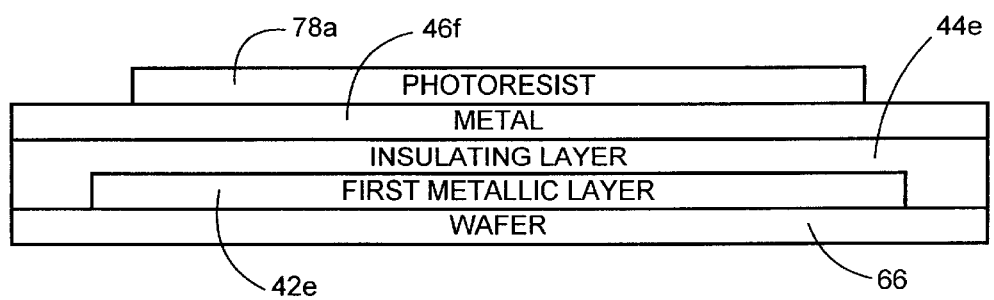
Figure 35:
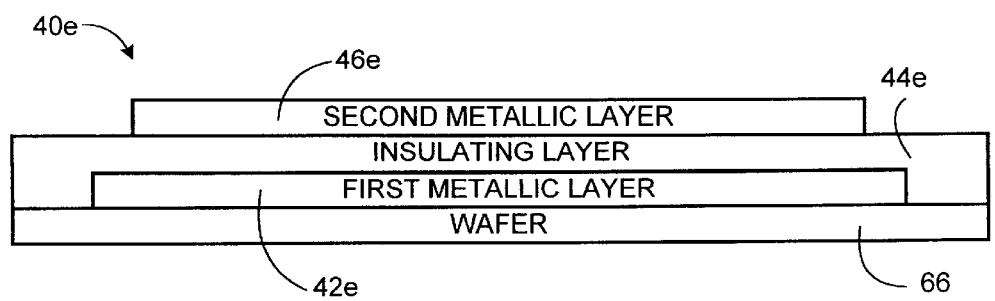

In step S47 a layer of insulating material 44e is deposited on the first metallic layer 42e and the exposed portions of wafer 66, as depicted in FIG. 31. In step S48, a second layer of metal 46f is deposited onto insulating layer 44e, as depicted in FIG. 32. In step S49 a layer of photoresist 78 is deposited onto second layer of metal 46f, as depicted in FIG. 33. In step S50, the pattern of the second metallic layer is transferred onto photoresist 78, and in step S51 that pattern is developed, leaving photoresist 78a on those portions of second layer of metal 46f which are to form the second metallic layer of the capacitor, while exposing the remainder of the metal, as depicted in FIG. 34. In step S52, the metal not protected by photoresist 78a is etched away, and step S53 photoresist 78a is removed, forming capacitor 40e with second metallic layer 46e on insulating layer 44e which is on first metallic layer 42e, which, in turn, is on wafer 66, as depicted in FIG. 35.

The patterns of the first and second metallic layers and the insulating layer can be transferred onto their respective underlying layers by optical lithographic means, and the pattern developed using a mask to define the desired shape. In the method of FIGS. 1–24, each mask covers the areas of the respective underlying layer onto which the corresponding metallic layer or insulating layer is not to be formed, so that the photoresist remains on such areas. Conversely, in the method of FIGS. 25–35, each mask covers the areas on which the corresponding metallic layer is to be formed, so that that area of the metal is not etched away. The metal can be deposited by evaporation techniques or by plating. In all embodiments of the invention, the mask results in the second metallic layer having rounded corners, as depicted in FIGS. 1, 17, 18, and 25. For optimum capacitor performance, the mask of the first metallic layer results in the first metallic layer also having rounded corners, as depicted in FIG. 17.

Figure 36:
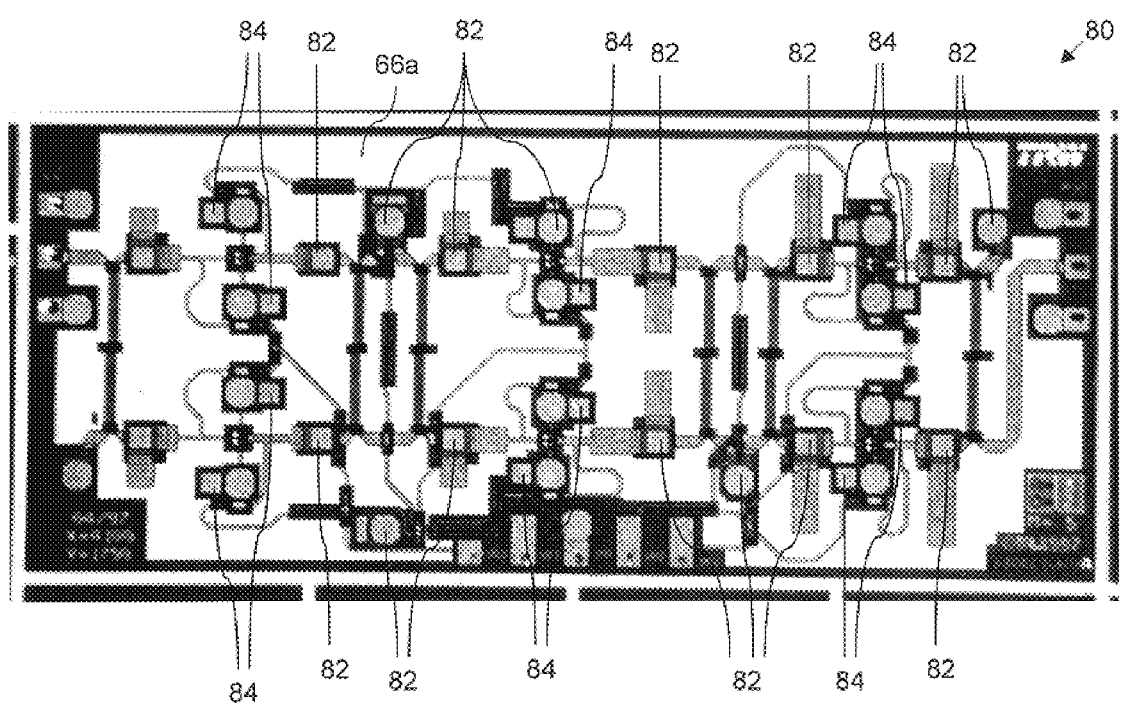
FIG. 36 depicts a MMIC including capacitors with rounded corners.

Capacitors with rounded corners in accordance with FIG. 17 have been found to have a three percent to twenty-eight percent higher ramped breakdown voltage than do capacitors with square corners. As a consequence, MMICs including such capacitors are more reliable. FIG. 36 depicts an MMIC 80 which includes a segment 66a of the original wafer 66. Segment 66a has on it a variety of active and passive components 82, such as transistors, resistors and inductors, as well as a number of capacitors 84 having rounder corners in accordance with the present invention. Typically, MMIC 80 might have dimensions of about one millimeter by two millimeters. In manufacturing capacitors in accordance with the present invention, an original wafer 66 might be circular, with a diameter in the order of two to six inches and might have several hundred, or even several thousand MMICs formed on it. The several MMICs are then cut from the original wafer.

Although the present invention has been described with reference to preferred embodiments, rearrangements, alterations, and substitutions could be made, and still the result would be within the scope of the invention.

What is claimed is:

1. A single-layer, metal-insulator-metal capacitor comprising:
   a first metallic layer with a substantially planar first surface, a substantially planar second surface extending substantially parallel with and substantially coextensive with the first metallic layer first surface, and planar side surfaces joining the first metallic layer first and second surfaces;
   an insulating layer with a substantially planar first surface, a substantially planar second surface extending substantially parallel with and substantially coextensive with the insulating layer first surface and contacting at least a substantial portion of the first metallic layer first surface, and planar side surfaces joining the insulating layer first and second surfaces; and
   a second metallic layer with a substantially planar first surface, a substantially planar second surface extending substantially parallel with and substantially coextensive with the second metallic layer first surface and contacting at least a substantial portion of the insulating layer first surface, and planar side surfaces joining the second metallic layer first and second surfaces, the second metallic layer first and second surfaces having rounded corners provided by the second metallic layer side surfaces.

2. A capacitor as claimed in claim 1, wherein the first metallic layer first and second surfaces have rounded corners provided by the first metallic layer side surfaces.

3. A capacitor as claimed in claim 1, wherein the length and width of the insulating layer are less than the length and width, respectively, of the first metallic layer; and the length and width of the second metallic layer are less than the length and width, respectively, of the insulating layer.

4. A capacitor as claimed in claim 3, wherein the first metallic layer first and second surfaces have rounded corners provided by the first metallic layer side surfaces.

5. A capacitor as claimed in claim 1, wherein the length of the insulating layer is greater than the length of the first metallic layer, and the width of the insulating layer is greater than the width of the first metallic layer.

6. A capacitor as claimed in claim 5, wherein the first metallic layer first and second surfaces have rounded corners provided by the first metallic layer side surfaces.

7. A capacitor as claimed in claim 5, wherein the length of the second metallic layer is substantially the same as the length of the first metallic layer, and the width of the second metallic layer is substantially the same as the width of the first metallic layer.

8. A capacitor as claimed in claim 7, wherein the first metallic layer first and second surfaces have rounded corners provided by the first metallic layer side surfaces.

9. A capacitor as claimed in claim 5, wherein the length of the second metallic layer is less than the length of the first metallic layer, and the width of the second metallic layer is less than the width of the first metallic layer.

10. A capacitor as claimed in claim 9, wherein the first metallic layer first and second surfaces have rounded corners provided by the first metallic layer side surfaces.

11. A capacitor as claimed in claim 1, wherein the length and width of the second metallic layer are less than the length and width, respectively, of the insulating layer.

12. A capacitor as claimed in claim 11, wherein the first metallic layer first and second surfaces have rounded corners provided by the first metallic layer side surfaces.

* * * * *